US007117405B2

United States Patent
Co et al.

(10) Patent No.: US 7,117,405 B2
(45) Date of Patent: Oct. 3, 2006

(54) EXTENDER CARD WITH INTERCEPTING EEPROM FOR TESTING AND PROGRAMMING UN-PROGRAMMED MEMORY MODULES ON A PC MOTHERBOARD

(75) Inventors: Ramon S. Co, Trabuco Canyon, CA (US); Tat Leung Lai, Torrance, CA (US); David Da-Wei Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 763 days.

(21) Appl. No.: 10/249,648

(22) Filed: Apr. 28, 2003

(65) Prior Publication Data

US 2004/0216011 A1 Oct. 28, 2004

(51) Int. Cl.
*G11C 29/00* (2006.01)
*G06F 11/00* (2006.01)
(52) U.S. Cl. .................................. 714/718; 714/42
(58) Field of Classification Search .................. None
See application file for complete search history.

(56) References Cited

U.S. PATENT DOCUMENTS

| | | | |
|---|---|---|---|
| 5,914,902 A | 6/1999 | Lawrence et al. | 365/201 |
| 5,963,464 A | 10/1999 | Dell et al. | 365/52 |
| 5,995,405 A | 11/1999 | Trick | 365/63 |
| 6,046,421 A | 4/2000 | Ho | 209/573 |
| 6,092,146 A | 7/2000 | Dell et al. | 711/5 |
| 6,178,526 B1 | 1/2001 | Nguyen et al. | 714/42 |
| 6,182,253 B1* | 1/2001 | Lawrence et al. | 714/718 |
| 6,226,729 B1 | 5/2001 | Stevens et al. | 711/171 |
| 6,272,584 B1 | 8/2001 | Stancil | 710/241 |
| 6,351,827 B1* | 2/2002 | Co et al. | 714/42 |
| 6,357,022 B1 | 3/2002 | Nguyen et al. | 714/42 |
| 6,363,450 B1 | 3/2002 | Lash et al. | 710/301 |
| 6,415,397 B1 | 7/2002 | Co et al. | 714/42 |
| 6,421,798 B1 | 7/2002 | Lin et al. | 714/718 |
| 6,457,155 B1 | 9/2002 | Dell et al. | 714/773 |
| 6,467,053 B1 | 10/2002 | Connolly et al. | 714/39 |
| 6,473,831 B1 | 10/2002 | Schade | 711/115 |
| 6,480,799 B1 | 11/2002 | Hunter | 702/117 |
| 6,519,172 B1 | 2/2003 | Rondeau et al. | 365/52 |
| 6,532,526 B1 | 3/2003 | Nizar et al. | 711/170 |
| 6,539,449 B1 | 3/2003 | Leddige et al. | 710/306 |
| 2001/0034865 A1 | 10/2001 | Park et al. | 714/724 |
| 2002/0133765 A1 | 9/2002 | Antosh et al. | 714/718 |
| 2002/0173926 A1 | 11/2002 | McCord | 702/120 |
| 2004/0211843 A1* | 10/2004 | Boker | 234/492 |

* cited by examiner

*Primary Examiner*—Christine T. Tu
(74) *Attorney, Agent, or Firm*—Stuart T. Auvinen (57) ABSTRACT

An extender card is plugged into a memory module socket on a personal computer (PC) motherboard. The extender card has a test socket that receives a memory module under test. The extender card has an intercepting EEPROM chip that receives device-select lines from the motherboard. One of the device-select lines from the motherboard to a module EEPROM chip on the memory module is blocked by the extender card and altered so that the intercepting EEPROM chip is read by the motherboard rather than the module EEPROM chip. A memory configuration is read from the intercepting EEPROM chip. The memory module is tested by the motherboard using the configuration from the intercepting EEPROM chip on the extender card. The module EEPROM chip is then programmed with the configuration by altering the intercepted device-select address to select the module EEPROM chip and not the intercepting EEPROM chip.

20 Claims, 7 Drawing Sheets

FIG. 1A

PRIOR ART

FIG. 1B

PRIOR ART

EM IS BLANK (UNPROGRAMMED)

A2=0, READ SPD FROM EX

TEST DRAM USING CONFIG. FROM EX

FIG. 4B

A2=1, WRITE CONFIG TO EM

EXTENDER CARD WITH INTERCEPTING EEPROM FOR TESTING AND PROGRAMMING UN-PROGRAMMED MEMORY MODULES ON A PC MOTHERBOARD

BACKGROUND OF INVENTION

This invention relates to testing of memory modules, and more particularly to testing memory modules having a configuration memory.

Electronic systems such as personal computers (PC's) often use small printed-circuit board (PCB) daughter cards known as memory modules instead of directly mounting individual memory chips on a motherboard. The memory modules are built to meet specifications set by industry standards, thus ensuring a wide potential market.

As more and more configurations of memory modules are specified, often with many different memory configurations being interchangeable with one another, the PC or other system must determine the exact configuration of any memory modules installed. Memory-sizing routines can be executed by the PC at boot-up, but more recently the configuration information is being stored on the memory module itself. A small programmable memory chip is added to these modules. The programmable memory is programmed with the specific configuration of that module. The PC can simply read the configuration from this memory rather than run the memory-sizing routine.

Figure 1A:
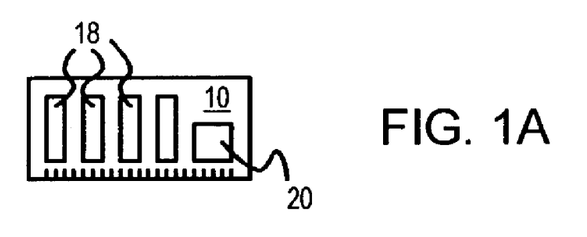
FIG. 1A shows a memory module having a programmable configuration memory.

FIG. 1A shows a memory module having a programmable configuration memory. Memory module 10 includes one or more dynamic-random-access memory (DRAM) chips 18 that are accessible through one or more rows of metal contacts that fit into a socket on the PC motherboard.

Memory module 10 also contains an electrically erasable and programmable read-only memory, EEPROM chip 20. The configuration of memory module 10 is programmed into EEPROM chip 20 by the module manufacturer. When memory module 10 is inserted into a socket on the PC motherboard, the PC reads the configuration in EEPROM chip 20 to determine the configuration of memory module 10.

This configuration information is determined by the size, type, and arrangement of DRAM chips 18. For example, the total number of bytes of storage, the width of the data bus, the number of column and row address bits, and the number or arrangement of banks can be programmed into EEPROM chip 20. Other useful information can be included, such as the type of DRAM chips 18 (clocked, non-clocked, etc.), timing parameters such as cycle and access times, voltages used, and burst capabilities. Revision codes and other information can also be stored.

Such configuration information can be stored in a relatively small amount of memory, such as in a 64-byte or 256-byte memory. EEPROM chip 20 can be reduced in the number of pins and cost by using serial data access rather than a byte-wide access. The PC can detect the presence of such an EEPROM chip 20 on memory module 10, and then read the configuration data out serially. Such an EEPROM chip 20 is sometimes known as a serial-presence-detect (SPD) EEPROM.

An expensive electronic test system can be used by the module manufacturer to test DRAM chips 18, and to write the configuration data to EEPROM chip 20. However, less expensive testers are desirable to reduce test costs. For example, modified PC motherboards have been used as testers of memory modules. See for example U.S. Pat. Nos. 6,357,022 and 6,415,397 by Nguyen et al. and Co et al., and assigned to Kingston Technology Company of Fountain Valley, Calif., These motherboard testers can cost 100 to 1000 times less than a specialized electronic test system since they are made from inexpensive PC motherboards.

Figure 1B:
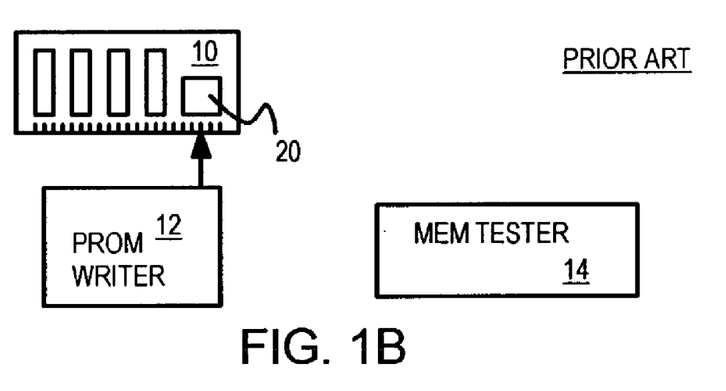
FIG. 1B shows pre-programming a configuration EEPROM chip during testing of a memory module.

FIG. 1B shows pre-programming a configuration EEPROM chip during testing of a memory module. PC motherboards read the configuration data from EEPROM chip 20 on memory module 10, so EEPROM chip 20 must be pre-programmed before testing by PC motherboard tester 14. Programmer 12 is a specialized device that generates signals to write the configuration information of memory module 10 into EEPROM chip 20.

Figure 1C:
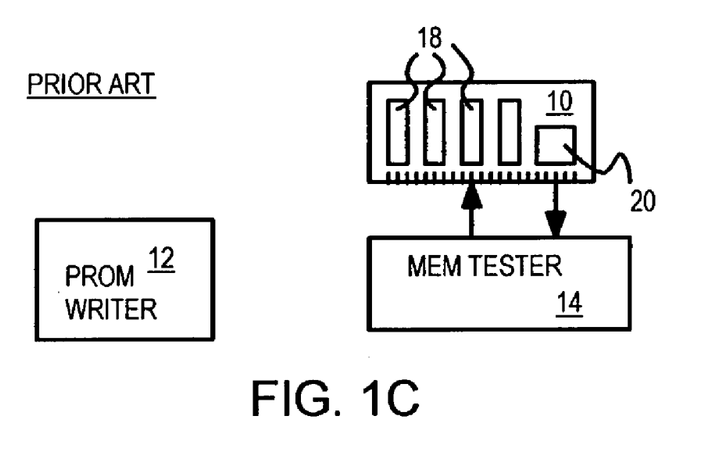
FIG. 1C shows a PC motherboard testing a memory module with a pre-programmed EEPROM chip.

Once EEPROM chip 20 has been programmed by programmer 12, then memory module 10 can be removed from programmer 12 and inserted into a socket on PC motherboard tester 14. FIG. 1C shows a PC motherboard testing a memory module with a pre-programmed EEPROM chip. Once memory module 10 is inserted into a socket on PC motherboard tester 14, the motherboard is re-booted, causing the PC initialization routines to search for and read the configuration information from EEPROM chip 20 on memory module 10. Then a memory test is performed by writing to and reading from each memory location in DRAM chips 18 on memory module 10. Failing modules can be identified and discarded.

When a low-cost PC motherboard tester is used, two separate steps are required: pre-programming the configuration EEPROM with programmer 12, and testing the memory module using PC motherboard tester 14. Since two test machines are used, two test stations and two insertion/removals are required, doubling the amount of handling required compared with testing a memory module without a configuration EEPROM.

The additional step of pre-programming the configuration into EEPROM chip 20 is required before testing by PC motherboard tester 14. This additional step requires that each memory module be inserted and removed from a socket on programmer 12, as well as be inserted and removed from a socket on PC motherboard tester 14. Pre-programming by programmer 12 is thus undesirable.

What is desired is a PC-motherboard tester that can test memory modules before configuration is programmed into an EEPROM chip on the memory module. An integrated tester that can test memory modules and then program configuration into the EEPROM chip is desirable.

DETAILED DESCRIPTION

The present invention relates to an improvement in memory module testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that many PC motherboards are capable of generating the signals to program configuration data into the configuration EEPROM chip on a memory module. However, the DRAMs on the memory module cannot be tested before the configuration EEPROM chip is programmed.

The inventors realize that an intercepting EEPROM chip can be used to supply the configuration data to the PC motherboard. This intercepting EEPROM chip supplies the configuration data to the PC motherboard before the EEPROM chip on the memory module has been programmed. Once the DRAM on the memory module has been tested, then the PC motherboard can write the configuration data to the EEPROM chip on the memory module.

The intercepting EEPROM eliminates the need for pre-programming the EEPROM chip on the memory module before testing. Thus programmer 12 of FIG. 1B is not needed. Instead, the EEPROM chip on the memory module is post-programmed, after the memory test is complete.

The intercepting EEPROM can be mounted on a riser or extender card that is inserted into a memory-module socket on the motherboard. The extender card has another socket on it that accepts the memory module being tested. The motherboard sends address and data signals to the intercepting EEPROM instead of the EEPROM chip on the memory module. Thus configuration data is supplied by the intercepting EEPROM on the extender card.

The intercepting EEPROM occupies the address space normally used by the EEPROM chip on the memory module. When the PC motherboard is booted, the normal initialization routines of the basic input-output system (BIOS) or operating system (OS) can be used to configure the memory system using the configuration from the intercepting EEPROM and then to test the memory module.

Figure 2A:
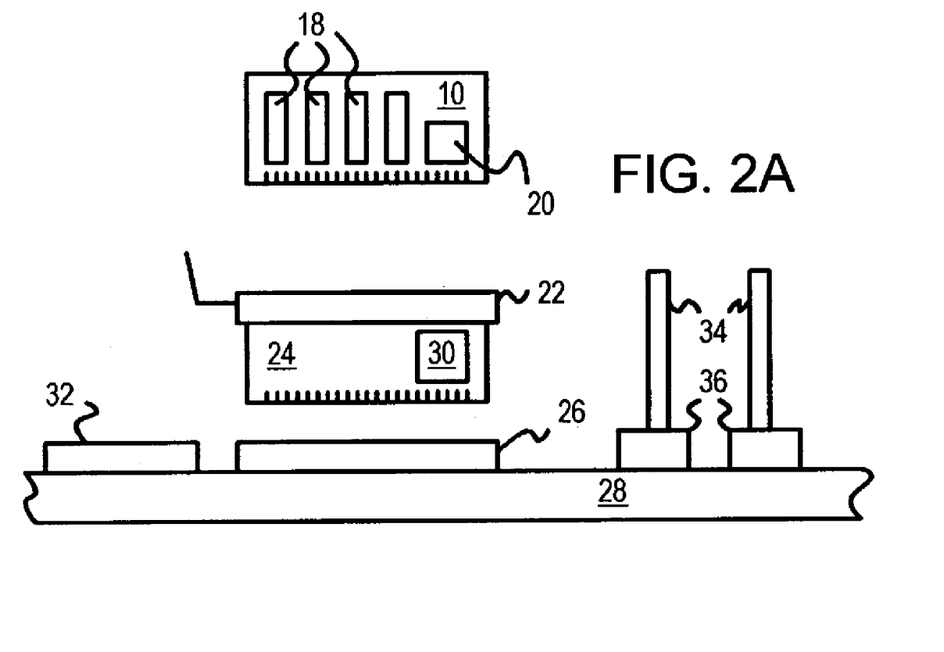
FIGS. 2A–B show an extender card with an intercepting EEPROM between a PC motherboard and an un-programmed memory module.
Figure 2B:
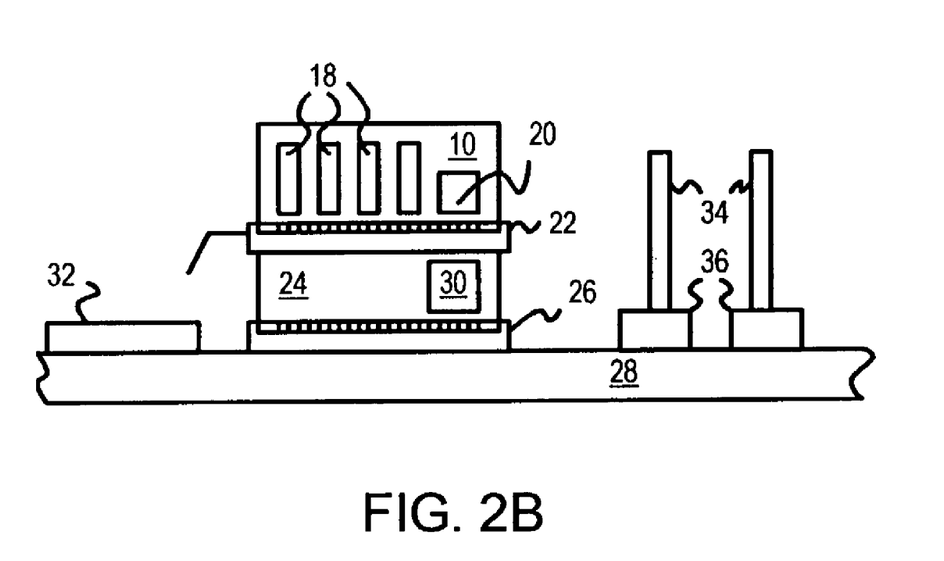

FIGS. 2A–B show an extender card with an intercepting EEPROM between a PC motherboard and an un-programmed memory module. In FIG. 2A, memory module 10 contains DRAM chips 18 and EEPROM chip 20. Configuration data has not yet been programmed into EEPROM chip 20.

Extender card 24 is a printed-circuit board (PCB) or other substrate that has test socket 22 mounted on its upper edge, and has metal fingers or contact pads along its bottom edge. Metal wiring traces on extender card 24 connect corresponding signals on the lower-edge contact pads to metal pads in test socket 22, thus passing most signals through. However, some signals are also routed to intercepting EEPROM chip 30 on extender card 24. This routing allows intercepting EEPROM chip 30 to be addressed by PC motherboard 28 rather than EEPROM chip 20 on memory module 10.

PC motherboard 28 is a larger PCB that has chips, sockets, and other components mounted thereon, such as chip 32 and expansion sockets 36 which have expansion cards 34 plugged in. Expansion cards 34 can be Peripheral Component Interconnect (PCI), AT-bus, or other expansion cards. Chip 32 can be the main microprocessor, chip set, cache memory, or other chips.

Memory module socket 26 is one of several sockets designed to fit memory module 10 or other memory modules. Memory module socket 26 is mounted to the PCB substrate of PC motherboard 28, and fits the contact pads on the bottom side of extender card 24, or the contact pads on memory module 10.

FIG. 2B shows the extender card with the intercepting EEPROM plugged into the PC motherboard. The contact pads on memory module 10 fit into test socket 22 on extender card 24. Test socket 22 can be a zero-insertion force test socket while memory module socket 26 on PC motherboard 28 is an inexpensive socket. Test socket 22 can also be a conventional memory module socket similar to memory module socket 26. The contact pads on the bottom edge of extender card 24 fit into memory module socket 26 on PC motherboard 28. Electrical contact is made by sockets 22, 26, with wiring traces on extender card 24 passing most signals through from PC motherboard 28 to memory module 10.

Figure 3:
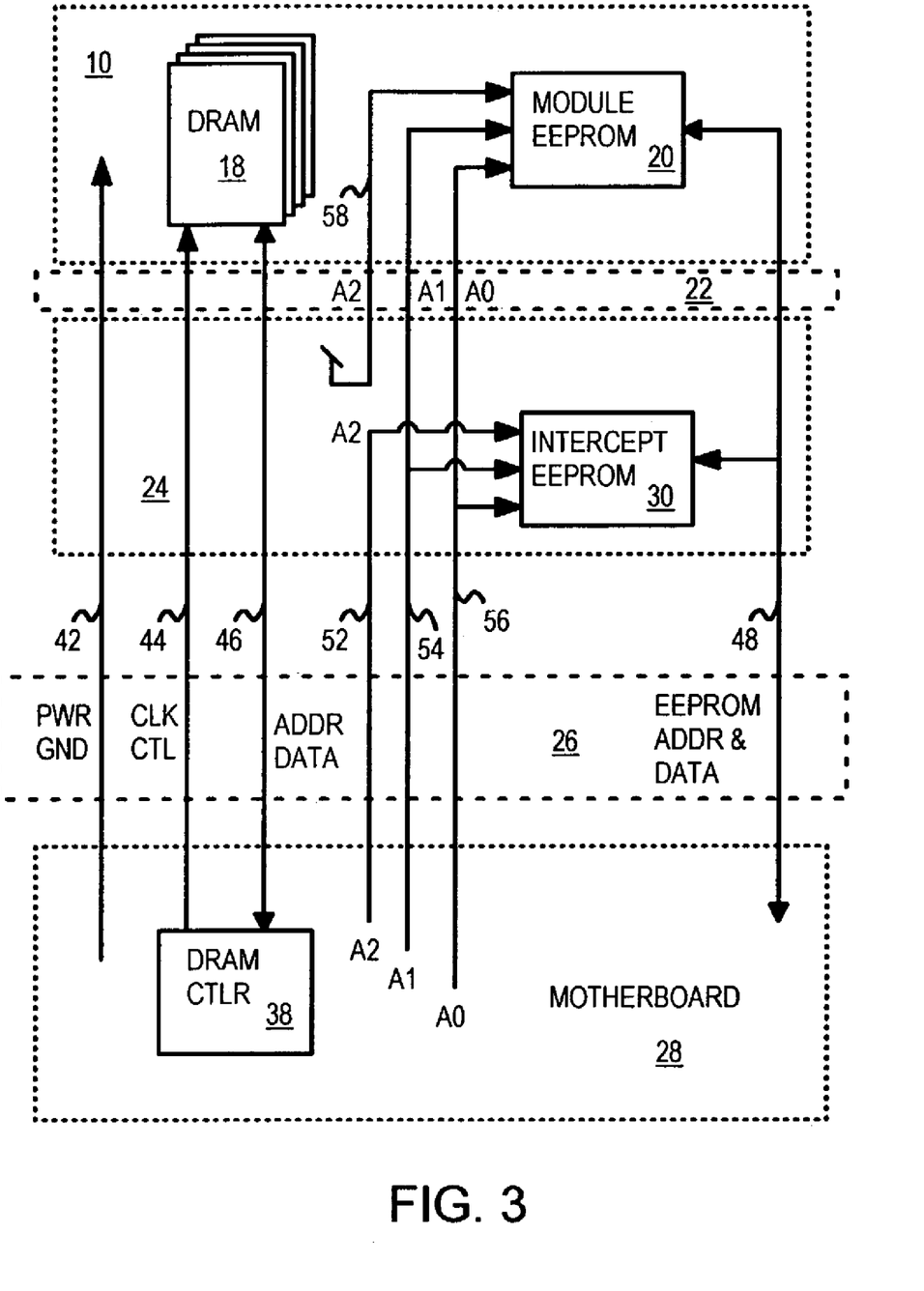
FIG. 3 is a wiring diagram showing connection of signals through the extender card to the memory module under test and interception of an address line by the intercepting EEPROM.

FIG. 3 is a wiring diagram showing connection of signals through the extender card to the memory module under test and interception of an address line by the intercepting EEPROM. Power and ground lines 42 from PC motherboard 28 are routed through contacts on socket 26 and wiring traces on extender card 24 to contacts on test socket 22 to power DRAM chips 18 and EEPROM chip 20 on memory module 10. Likewise, address, data signals 46 and control signals 44 from DRAM controller 38 on PC motherboard 28 are passed through extender card 24 and sockets 22, 26 to reach DRAM chips 18 on memory module 10. When DRAM chips 28 are synchronous DRAMs, control signals 44 can include a clock signal or strobes.

Serial data lines 48 include a serial data line and a serial clock and are routed from PC motherboard 28 to intercepting EEPROM chip 30 on extender card 24 and to module EEPROM chip 20 on memory module 10. These lines 48 could be generated by a chip set containing DRAM controller 38, or by other logic on PC motherboard 28 such as a Universal Asynchronous Receiver Transmitter (UART), or I/O registers written and read by a program. PC motherboard 28 sends a series of data bits on a serial-data line in lines 48 to serially transmit commands, a dynamic device-address, and configuration data to intercepting EEPROM chip 30 or to module EEPROM chip 20.

Device-address lines A2, A1, A0 are static lines that can be connected to power or ground using resistors or jumpers or direct wiring-trace connections. Each slot or memory module socket has a unique device-address A2, A1, A0. When the dynamic device-address sent serially over serial data lines 48 matches the EEPROM's static device address A2, A1, A0, then the EEPROM is selected for access. Other EEPROMs ignore the serial sequence when their static device-addresses on line 52, 54, 56 do not match the dynamic device-address serially transmitted over serial data lines 48.

PC motherboard 28 can select one memory module and its module EEPROM chip from up to 8 memory module sockets. Each memory module socket occupies a slot or unique device-address location of the A2, A1, A0 select lines. The A2, A1, A0 select lines for each slot are hardwired to a different value. For example, the first slot has its socket wired so that A2, A1, A0 are all grounded (000), while the second slot has A2, A1 grounded but A0 high (001). The fourth memory module socket, the fourth slot, has A2 grounded but A1, A0 high (011).

Since most motherboards contain only 4 memory-module sockets, A2 is normally kept low, as only A1, A0 are needed to select from among 4 sockets. Each socket has a unique device-address that is hardwired into the socket's connections. When only 4 sockets are present on a motherboard, the hardwired socket device-addresses are usually 000, 001, 010, 011, all with A2=0.

The lowest two device-address signals, A1, A0, lines 54, 56, are routed to both intercepting EEPROM chip 30 and to module EEPROM chip 20. However, upper device-address signal A2, line 52 is routed only to intercepting EEPROM chip 30 and not to module EEPROM chip 20. Instead, device-address signal A2, line 58, to module EEPROM chip 20 is driven high, such as by being connected to the power-supply line on extender card 24, either directly or through a resistor (not shown). Thus intercepting EEPROM chip 30 is addressable using A2=0, while module EEPROM chip 20 is addressable using A2=1.

Figure 4A:
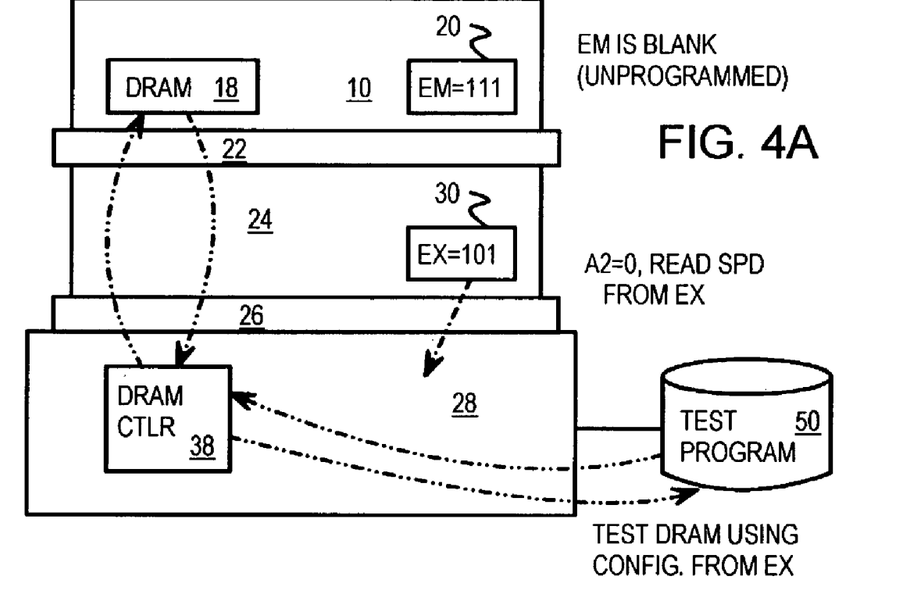
FIG. 4A highlights a PC motherboard testing a memory module using an intercept EEPROM on an extender card.

FIG. 4A highlights a PC motherboard testing a memory module using an intercept EEPROM on an extender card. Extender card 24 is plugged into socket 26 on PC motherboard 28. Each new memory module under test is inserted into test socket 22 on extender card 24 and PC motherboard 28 re-booted to start memory testing. Extender card 24 normally remains plugged into socket 26 as many memory modules under test are inserted and removed from test socket 22.

Module EEPROM chip 20 (EM) has just been manufactured and mounted on memory module 10, and is still un-programmed. Un-programmed (blank) EEPROM chips typically contain all ones data (EM=111 . . . ). However, intercepting EEPROM chip 30 has already been programmed with the configuration for memory module 10 (EX=101 . . . ).

Device-address line A2, which is tied low by PC motherboard 28, is coupled to intercepting EEPROM chip 30, while device-address A2 to module EEPROM chip 20 is tied high. Thus module EEPROM chip 20 responds to select line A2=1, while intercepting EEPROM chip 30 responds to A2=0. Both respond to the same A1, A0 device-address lines. For example, for the third slot of 4 memory module slots, intercepting EEPROM chip 30 responds to dynamic device-address 010, while module EEPROM chip 20 responds to dynamic device-address 110.

After a new memory module 10 has been inserted into test socket 22 for testing, PC motherboard 28 is re-booted. Re-booting PC motherboard 28 causes the BIOS and OS initialization routines to be activated. These routines can reside in non-volatile memory on the PC motherboard, or on disk 50, or on both. The BIOS initialization routine looks for the presence of a serial-data EEPROM for each memory module socket.

The BIOS sends a stream of serial data over the serial data line to all memory module sockets. When there are four memory module sockets on PC motherboard 28, then the serial stream has four sequences of commands with different dynamic device-addresses to check for an EEPROM in each of the four slots. When a serial-presence-detect EERPOM is present, it responds to one of the four sequences that has a dynamic device-address that matches its A2, A1, A0 static device-address inputs. The BIOS routine then reads the responding EEPROM's configuration sent over the serial data line. For many motherboards with only 4 memory module slots, select line A2 is always low.

Since select line A2 is intercepted by extender card 24 and forced high to module EEPROM chip 20, the BIOS, using A2=0, does not access EEPROM chip 20 on memory module 10. Instead, intercepting EEPROM chip 30 is read for the configuration data. This configuration data has previously been programmed into intercepting EEPROM chip 30 and can remain the same for many batches or production runs of memory modules of the same size and type.

Once the BIOS on PC motherboard 28 has determined the memory configuration, DRAM controller 38 can be configured for the memory size, type, and timing. Addresses from the microprocessor can be routed to different row and column address lines to DRAM chips 18 for different memory sizes. The number of clock cycles between control signals sent from DRAM controller 38 to DRAM chips 18 can be adjusted to meet the timing parameters in the configuration. The BIOS can then verify the configuration by writing and reading back data from locations in the configured memory of DRAM chips 18.

More extensive test programs can be executed that write and read each location in DRAM chips 18 using a variety of test patterns such as walking ones and zeros, checkerboard, etc. These test patterns are executed on the microprocessor on PC motherboard 28 from test code stored in disk 50, although some test programs may also exist in the BIOS.

Since extender card 24 passes through signals from DRAM controller 38 to DRAM chips 18, DRAM chips 18 can be tested as if memory module 10 was plugged directly into socket 26 on PC motherboard 28. However, the configuration used by the BIOS on PC motherboard 28 was read from intercepting EEPROM chip 30, not from module EEPROM chip 20. Module EEPROM chip 20 remains in a blank, un-programmed state throughout the testing of DRAM chips 18.

Should testing of DRAM chips 18 reveal a fault, memory module 10 can be immediately removed and discarded, or placed in a failure bin. Overall test time can be reduced, since the testing of DRAM chips 18 can be halted at the first failure. Also, slow programming of the serial configuration data into module EEPROM chip 20 can be avoided for failing memory modules.

Figure 4B:
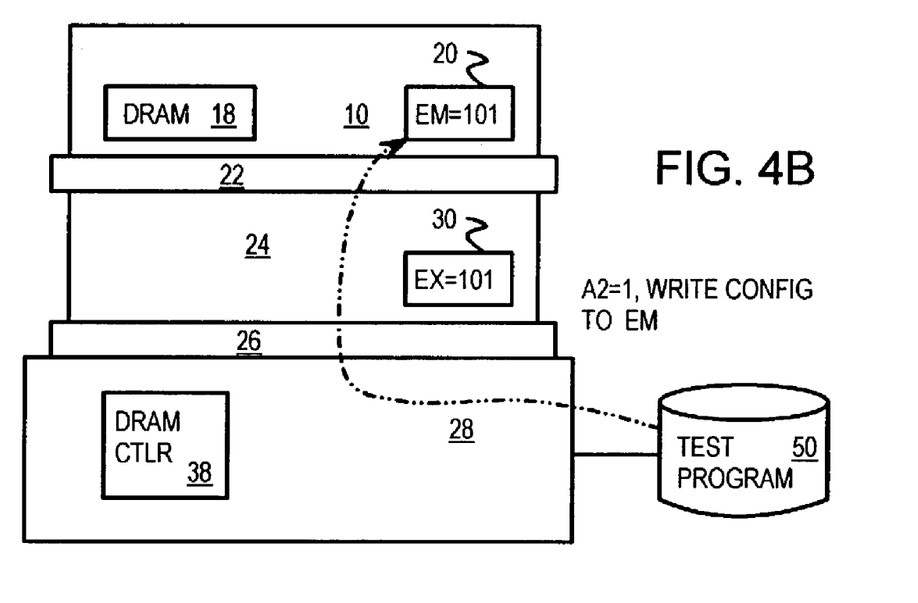
FIG. 4B highlights a PC motherboard programming an EEPROM chip on a memory module through an extender card.

FIG. 4B highlights a PC motherboard programming an EEPROM chip on a memory module through an extender card. Once DRAM chips 18 have passed the test, the configuration data is programmed into module EEPROM chip 20.

The test program on disk 50 activates EEPROM writing code after memory tests have passed. This writing code causes PC motherboard 28 to generate a command sequence on the serial data line to module EEPROM chip 20. The dynamic device-address is the address of the slot or memory module socket containing memory module 10, except that upper device-address A2 is set high. For example, the second slot has a device-address of 001, which is modified to 101 by setting A2 high.

This modified dynamic device-address is sent over the serial data line and is read by both intercepting EEPROM chip 30 and module EEPROM chip 20. However, since intercepting EEPROM chip 30 has its A2 input tied low, intercepting EEPROM chip 30 ignores the serial sequence as the dynamic device-address does not match. The dynamic device-address on the serial data line matches the static device-address of module EEPROM chip 20, since it has A2 tied high.

The EEPROM-writing code causes PC motherboard 28 to send the configuration data over the serial data line. The command to write the configuration data is ignored by intercepting EEPROM chip 30, but is acted upon by module EEPROM chip 20, which writes the configuration data into its memory and responds with an acknowledging signal.

The writing code on disk 50 may perform a verification by reading the configuration data back from module EEPROM chip 20. If the verification fails, programming may be repeated until the configuration data is properly stored. Should programming fail, memory module 10 can be removed and discarded for failure of module EEPROM chip 20.

Both testing of DRAM chips 18 and programming the configuration into module EEPROM chip 20 can be performed during the same insertion of memory module 10 into extender card 24. Only one insertion and removal of memory module 10 is needed for both DRAM testing and EEPROM programming.

Figure 5:
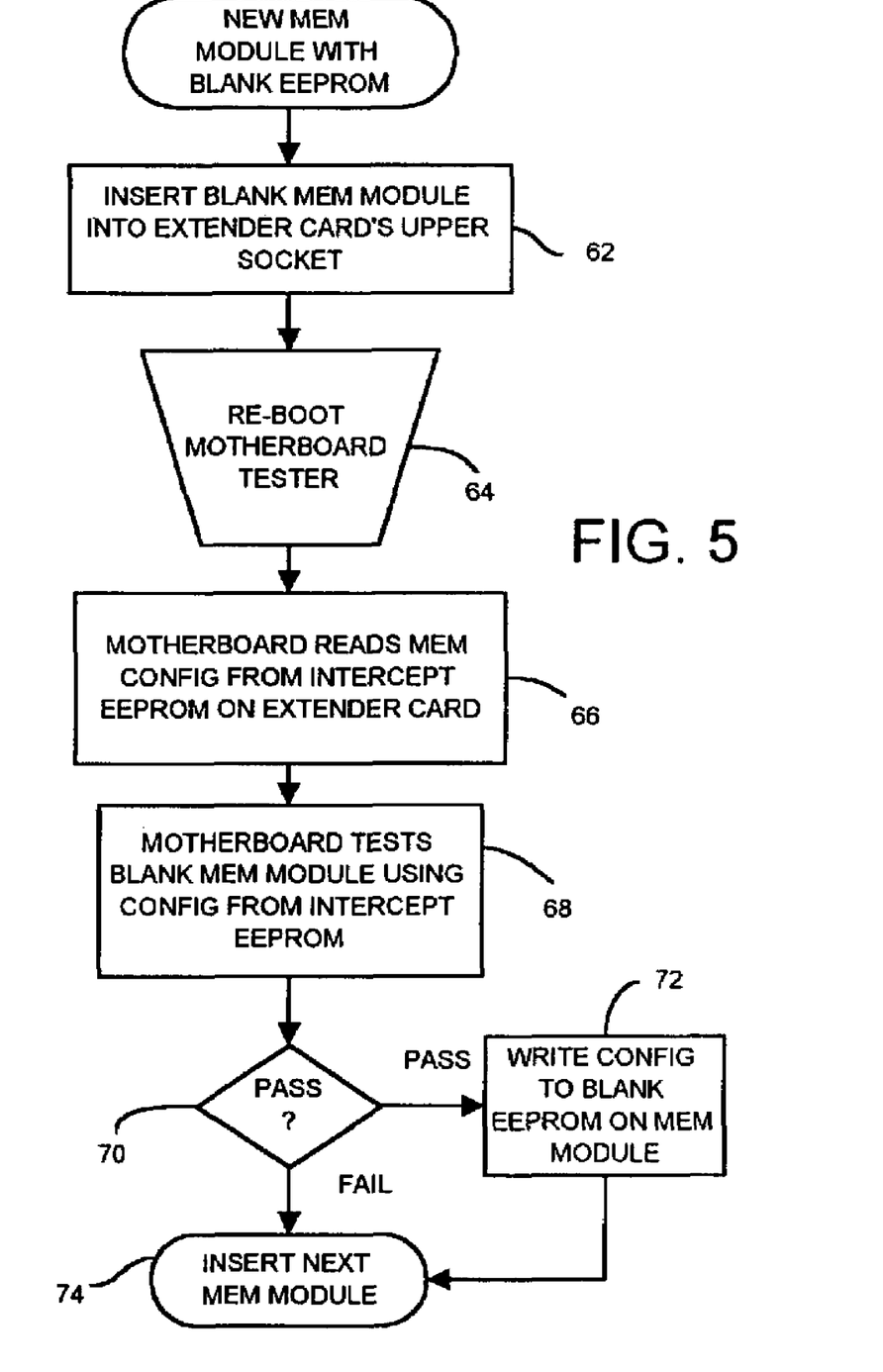
FIG. 5 is a flowchart of testing and programming of a memory module using an extender card with an intercepting EEPROM chip.

FIG. 5 is a flowchart of testing and programming of a memory module using an extender card with an intercepting EEPROM chip. A newly-manufactured memory module is inserted into the test socket on the extender card 24, step 62. The extender card is already plugged into a memory module socket on a PC motherboard. The PC motherboard is re-booted, such as by cycling power or by activating a hardware or software reset, step 64.

Re-booting the PC motherboard causes the BIOS initialization routine to be activated. The BIOS reads the configuration from the intercepting EEPROM chip, step 66. The BIOS generates serial data sequences for each of the four memory module slots, but has A2=0 since the motherboard has only 4 slots. Since the module's EEPROM chip has its A2 device-address input tied high by the extender card, the module EEPROM chip does not respond, only the intercepting EEPROM chip does.

The BIOS uses the configuration from the intercepting EEPROM chip, along with any configuration data from other installed memory modules or from testing for memory that does not have a configuration EERPOM. The configuration data from all these sources is used to set up the addressing of each memory module, and the configuration from the intercepting EEPROM chip is used to more specifically set up the timing of access to the memory module inserted into the extender card.

Once the memory has been configured, a variety of tests can be performed. The BIOS may perform some basic testing, but more extensive testing can be performed by more specialized test programs that are executed by the PC motherboard, step 68. If the memory module fails one or more tests, step 70, the module can be rejected and removed. An operator can be notified by a light activated by the PC motherboard, or a robotic arm or automated handler can be signaled through a network interface to remove the memory module and place it in a failure bin.

When the DRAM on the memory module passes all tests, step 70, then the configuration data is programmed into the module's EEPROM chip, step 72. A programming sequence of serial data is generated by a UART or other device on the PC motherboard and sent to the module's EEPROM chip over the serial data line. The device-address for the slot the memory module is in is modified by setting A2 high so that the module EEPROM chip and not the intercepting EEPROM chip is programmed. Once programming is completed, the programmed memory module can be removed from the test socket and placed in a pass bin, and another memory module inserted, step 74.

Figure 6:
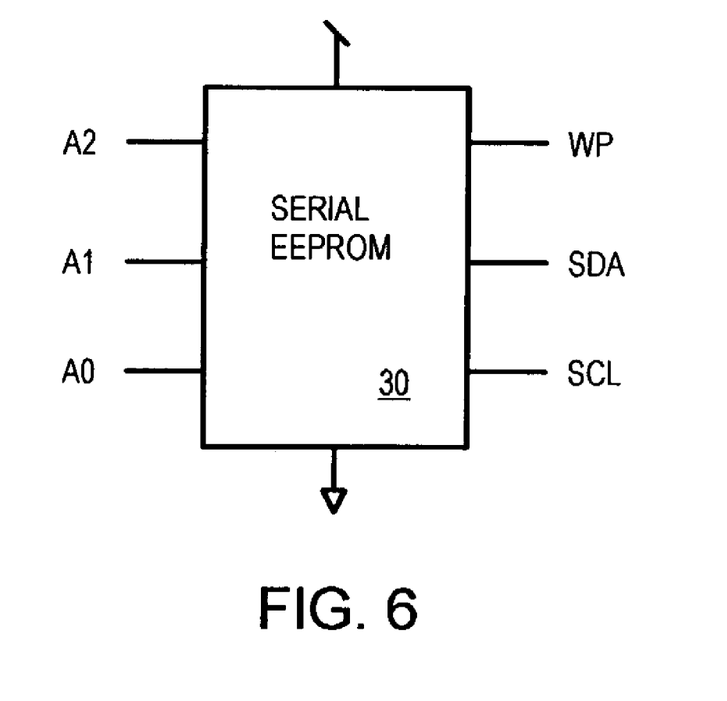
FIG. 6 is a diagram of the pins on a serial-presence-detect (SPD) EEPROM chip.

FIG. 6 is a diagram of the pins on a serial-presence-detect (SPD) EEPROM chip. Intercepting EEPROM chip 30, like module EEPROM chip 20, receives power and ground, and internally generates a higher programming voltage that is above the power-supply. A static device-address is applied to chip 30 on device-address inputs A2, A1, A0. Each memory module slot has a different device-address, and the A2 line is tied low for the intercepting EEPROM chip 30 but high for the module EEPROM chip 20 in this embodiment.

Write-protect input WP is a remnant of older EEPROM specifications and is no longer used. Input WP is a no-connect.

Serial data lines include a serial clock line applied to the serial clock SCL input, and a serial data line applied to the serial data SDA input. Address, data, and command information are all transmitted over the serial data line. The serial clock SCL is a clock that indicates when the serial data is valid and to be sampled. Each pulse of the serial clock can correspond to one bit of serial data, for example.

EEPROM chip 30 compares a dynamic device-address that is sent over the serial data line to its serial data SDA input to the static device-address of the A2, A1, A0 inputs. When the dynamic (serial) device-address matches the static device-address, EEPROM chip 30 is activated; otherwise it ignores the rest of the serial sequence.

Figure 7A:
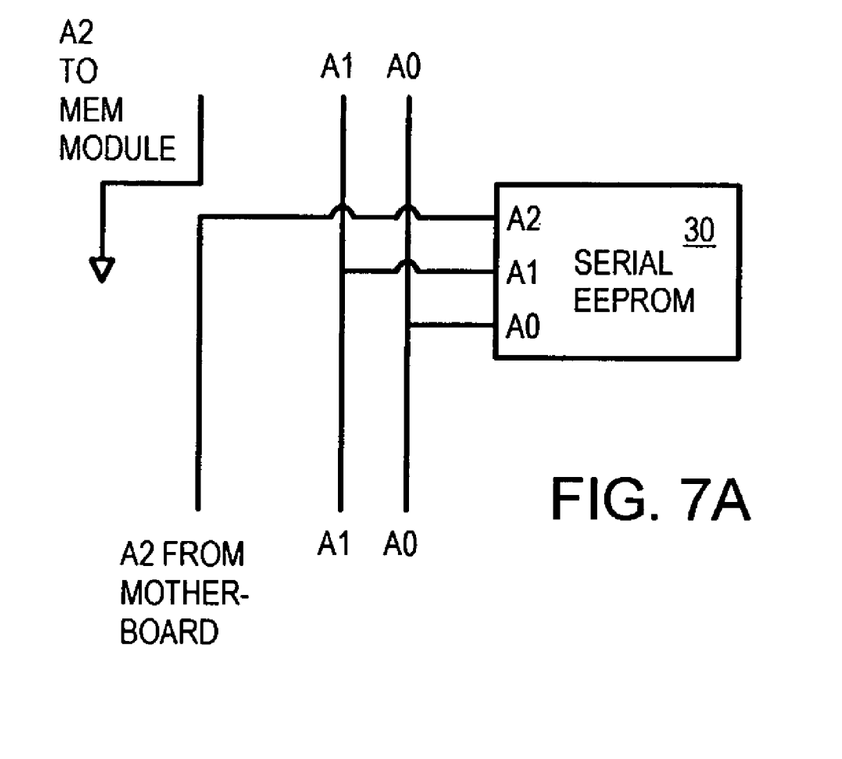
FIGS. 7A–C shows alternate embodiments of device-address wiring on the extender card.

FIGS. 7A–C shows alternate embodiments of device-address wiring on the extender card. In FIG. 7A, some motherboards may set A2 high rather than low, or may use all 8 slots. A2 from the PC motherboard can be applied to intercepting EEPROM chip 30, while A2 to the module EEPROM chip is connected to ground. Lower device-address lines A1, A0 are applied to both EEPROM chips 20, 30 and select from among four slots. Intercepting EEPROM chip 30 can be selected by A2=1, while module EEPROM chip 20 can be selected by A2=0. The BIOS for this kind of PC motherboard uses A2=1 during initialization, while the EEPROM-writing code in the specialized test program sets A2=0 to program the module's EEPROM chip.

Figure 7B:
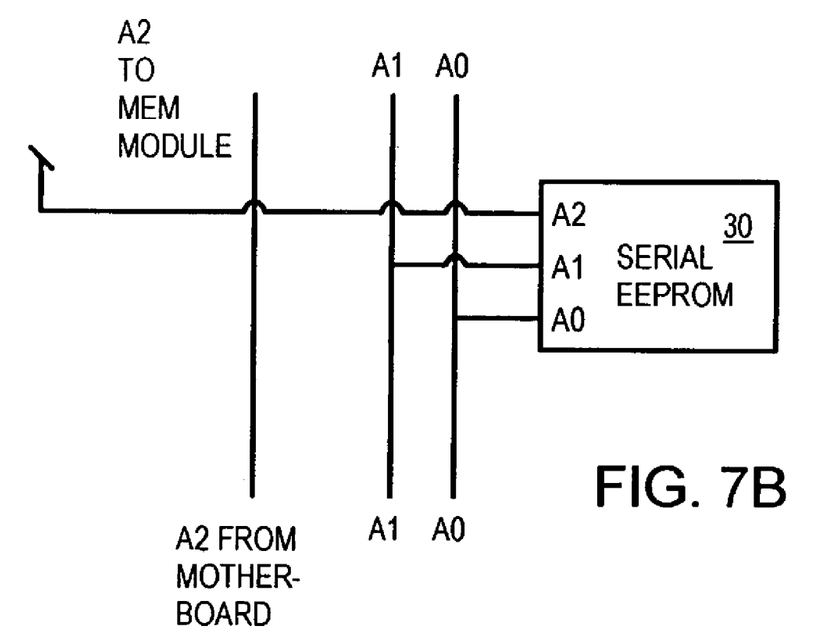

In FIG. 7B, the A2 line from the PC motherboard can be passed through the extender card to module EEPROM chip 20. Device-address A2 to intercepting EEPROM chip 30 is tied high. A1, A0 are applied to both EEPROM chips 20, 30. Intercepting EEPROM chip 30 can be selected by A2=1, while module EEPROM chip 20 can be selected by A2=0. The BIOS for this kind of PC motherboard should use A2=1 during initialization, while the EEPROM-writing code in the specialized test program sets A2=0 to program the module's EEPROM chip.

Figure 7C:
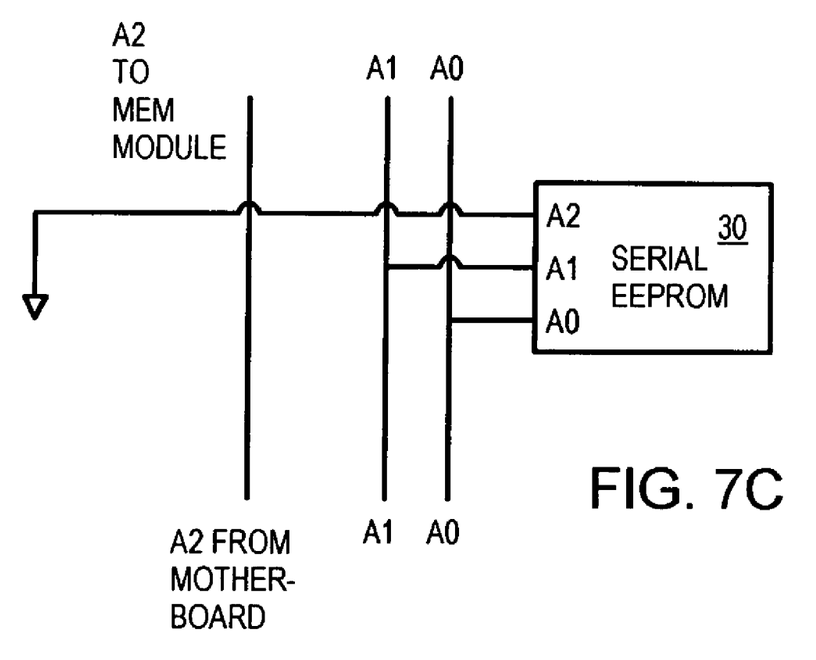

In FIG. 7C, the A2 line from the PC motherboard is passed through the extender card to module EEPROM chip 20, but device-address A2 to intercepting EEPROM chip 30 is tied low. A1, A0 are applied to both EEPROM chips 20, 30. Intercepting EEPROM chip 30 can be selected by A2=0, while module EEPROM chip 20 can be selected by A2=1. The BIOS for this kind of PC motherboard should use A2=0 during initialization, while the EEPROM-writing code in the specialized test program sets A2=1 to program the module's EEPROM chip.

Another embodiment can ignore the A2 device-address from the motherboard entirely. Instead, extender card 24 ties the A2 input to intercepting EEPROM chip 30 to ground, and ties the A2 input to module EEPROM chip 20 to the power-supply. Intercepting EEPROM chip 30 is selected by A2=0, while module EEPROM chip 20 can be selected by A2=1. The BIOS for this kind of PC motherboard should use A2=0 during initialization, while the EEPROM-writing code in the specialized test program sets A2=1 to program the module's EEPROM chip.

Another alternate embodiment that ignores the A2 device-address from the motherboard has the extender card 24 tying the A2 input to intercepting EEPROM chip 30 to the power-supply, and ties the A2 input to module EEPROM chip 20 to ground. Intercepting EEPROM chip 30 can be selected by A2=1, while module EEPROM chip 20 can be selected by A2=0. The BIOS for this kind of PC motherboard should use A2=1 during initialization, while the EEPROM-writing code in the specialized test program sets A2=0 to program the module's EEPROM chip.

The extender card could also have an inverter that receives the A2 line from the PC motherboard. The inverter's output is connected to either EEPROM chip 20, 30, while the inverter's input is connected to the other EEPROM chip 20, 30. More complex logic could be substituted. More than four sockets could be supported, and sockets populated with memory modules without configuration EEPROMs could be used in slots aliased by the extender card's EEPROM.

The extender card can prolong the life of the PC motherboard tester, since the extender card is not removed from its motherboard socket as often as the memory modules being tested are inserted and removed from the test socket on the extender card. Ordinary memory module sockets on the motherboard can be used, since the extender card is removed only infrequently. Thus the memory module socket on the motherboard does not have to be replaced by a specialized test socket, reducing the cost of the PC motherboard tester.

ALTERNATE EMBODIMENTS

Several other embodiments are contemplated by the inventors. The intercepting EEPROM can be a flash memory using electrically-erasable transistors, or can be a one-time-only programmable memory using a variety of technologies such as fuses or transistors. While the EEPROM chip on the memory module must be non-volatile, the intercepting EEPROM chip could be volatile but use an external power supply such as a small battery. The preferred embodiment simply uses the same kind of EEPROM chip for the intercepting EEPROM as used on most memory modules, but this is not necessary.

The memory module may contain additional components, such as passive capacitors and resistors, and active components such as buffer chips, and registers for buffering control, address, or data lines.

The PC motherboard can be a standard motherboard, or can be a modified board, such as one having the socket for the extender card reverse-mounted on the solder side rather than the component side of the motherboard substrate. The PC motherboard can be one of several in a larger test system, such as in a robotic test system. A handler can automatically insert and remove the memory modules being tested, or a robotic arm or human operator can handle the memory modules under test.

More than one of the memory module slots on the PC motherboard may be loaded with an extender card, allowing two or more memory modules to be tested at the same time by the same PC motherboard. Each memory module socket or slot has a different value of device-address lines A2, A1, A0, so each slot can be accessed separately. Using two or more extender cards and slots increases testing throughput.

The A2 device-address line could be tied low on extender card 24 rather than by the motherboard. The A2 line from the motherboard could be ignored. An inverter could be mounted on extender card 24 to simply invert A2 to module EEPROM chip 20. Other device-address lines could be intercepted.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An extender card comprising:
   a substrate containing wiring traces for conducting signals;
   first contact pads along a first edge of the substrate, the first contact pads for mating with a memory module socket on a motherboard;
   a test socket, mounted to the substrate, for receiving a memory module during testing and programming;
   an intercepting electrically erasable and programmable read-only memory (EEPROM) chip, mounted on the substrate, the intercepting EEPROM chip for being programmed with a configuration for the memory module inserted into the test socket, the configuration from the intercepting EEPROM chip being read by the motherboard before testing of the memory module inserted into the test socket;
   wherein the wiring traces on the substrate include lines carrying address, data, and controls signals from the motherboard that are passed through to the test socket at pads for connecting to memory chips on the memory module;
   wherein the wiring traces on the substrate include a first device-address line and a second device-address line;
   wherein the first device-address line connects to a device-address input of the intercepting EEPROM chip;

wherein the second device-address line connects to the test socket at a pad location for connecting to a device-address input of a module EEPROM chip on the memory module; and device-address intercept means, on the substrate, for causing the first device-address line and the second device-address line to have opposite states, wherein when the first device-address line is high then the second device-address line is low, or when the first device-address line is low then the second device-address line is high, whereby the extender card alters device addresses so that the second device-address line to the module EEPROM chip and the first device-address line to the intercepting EEPROM chip have opposite states.

2. The extender card of claim 1 wherein the device-address intercept means comprises:

a connection from the second device-address line to a power-supply pad in the first contact pads, the power-supply pad for connecting to a power-supply on the motherboard, the connection including a wiring trace or a resistor;

wherein the first device-address line comprises a first wiring trace from a device-address pad in the first contact pads to the device-address input of the intercepting EEPROM chip, the device-address pad for connecting to a device-address line on the motherboard that is connected to a ground on the motherboard;

wherein the module EEPROM chip is activated by the motherboard sending a dynamic device-address that corresponds to a device-address line being high, but the intercepting EEPROM chip is activated by the motherboard sending the dynamic device-address that corresponds to the device-address line being low.

3. The extender card of claim 2 wherein the wiring traces further comprise a serial-data line, connected to a serial-data pad on the first contact pads that receives serial data from the motherboard, and connected to a serial-data pad on the test socket that connects to a serial-data input of the module EEPROM chip, the serial-data line also being connected to a serial-data input of the intercepting EEPROM chip.

4. The extender card of claim 3 wherein the module EEPROM chip and the intercepting EEPROM chip are serial-presence-detect EEPROMs that each have a serial-data input that serially receives commands and dynamic device-addresses from the motherboard over the serial-data line on the extender card.

5. The extender card of claim 4 wherein the intercepting EEPROM chip and the module EEPROM chip each has a plurality of device-address inputs;

wherein the device-address intercept means alters the device-address line to a most-significant of the device-address inputs of the module EEPROM chip.

6. The extender card of claim 5 wherein the memory chips on the memory module are dynamic-random-access memory (DRAM) memory chips.

7. The extender card of claim 6 wherein the substrate contains only the intercepting EEPROM chip and no other integrated circuit chips.

8. The extender card of claim 1 wherein the device-address intercept means comprises:

a connection from the second device-address line to a ground pad in the first contact pads, the ground pad for connecting to a ground on the motherboard, the connection including a wiring trace or a resistor;

wherein the first device-address line comprises a first wiring trace from a device-address pad in the first contact pads to the device-address input of the intercepting EEPROM chip, the device-address pad for connecting to a device-address line on the motherboard that is connected to a power-supply on the motherboard;

wherein the module EEPROM chip is activated by the motherboard sending a dynamic device-address that corresponds to a device-address line being low, but the intercepting EEPROM chip is activated by the motherboard sending the dynamic device-address that corresponds to the device-address line being high.

9. The extender card of claim 1 wherein the device-address intercept means comprises:

a connection from the first device-address line to a ground pad in the first contact pads, the ground pad for connecting to a ground on the motherboard, the connection including a wiring trace or a resistor;

wherein the second device-address line comprises a pass-through wiring trace from a device-address pad in the first contact pads to the test socket at the pad location for connecting to the device-address input of the module EEPROM chip on the memory module;

wherein the module EEPROM chip is activated by the motherboard sending a dynamic device-address that corresponds to a device-address line being high, but the intercepting EEPROM chip is activated by the motherboard sending the dynamic device-address that corresponds to the device-address line being low.

10. A motherboard-based memory-module tester comprising:

a personal computer motherboard having a microprocessor for executing programs;

a plurality of memory module sockets on the personal computer motherboard for receiving memory modules containing memory chips;

an extender card having lower contact pads for fitting into one of the plurality of memory module sockets;

a test socket on the extender card for receiving a memory module under test, the memory module under test having a programmable chip for storing a configuration;

memory-signal wiring traces on the extender card for passing memory signals through from the lower contact pads to the test socket, the memory signals being generated by the personal computer motherboard to access the memory chips on the memory module under test;

a configuration chip on the extender card that stores a configuration for the memory chips on the memory module under test;

configuration wiring traces on the extender card that pass configuration signals through from the lower contact pads to the programmable chip through the test socket and to the configuration chip;

wherein the configuration signals carry a dynamic device-address;

device-address inputs on the configuration chip that are coupled by wiring traces on the extender card to device-address signals from the personal computer motherboard, the device-address signals uniquely identifying one of the memory module sockets in the plurality of memory module sockets; and device-address wiring traces on the extender card for connecting to device-address inputs on the programmable chip through the test socket;

wherein at least one of the device-address wiring traces to the programmable chip is an altered address so that the device-address inputs to the programmable chip differ from the device-address inputs to the configuration chip;

wherein when the dynamic device-address on the configuration wiring traces matches the device-address inputs to the configuration chip, the personal computer motherboard reads the configuration from the configuration chip on the extender card, but when the dynamic device-address on the configuration wiring traces matches the device-address inputs to the programmable chip, the personal computer motherboard writes the configuration to the programmable chip on the extender card, whereby the configuration is read from the configuration chip on the extender card, but written to the programmable chip on the memory module under test.

11. The motherboard-based memory-module tester of claim 10 wherein the configuration signals include serial sequences that include a command, a dynamic device-address, and data, the serial sequences being generated by the personal computer motherboard to read the configuration chip on the extender card or to write a configuration to the programmable chip on the memory module under test.

12. The motherboard-based memory-module tester of claim 11 wherein the configuration signals include a bi-directional serial data line that transfers signals generated by the personal computer motherboard and signals generated by the configuration chip.

13. The motherboard-based memory-module tester of claim 12 wherein the programs executed by the microprocessor comprise:

a memory-configuration program that generates configuration signals with the dynamic device-address matching the device-address inputs to the configuration chip to read the configuration from the configuration chip on the extender card;

a memory-test program that generates the memory signals to test the memory chips on the memory module under test using the configuration from the configuration chip; and a writer program that generates configuration signals with the dynamic device-address matching the device-address inputs to the programmable chip to write the configuration to the programmable chip on the memory module under test, whereby programs are executed to read the configuration from the extender card, to test the memory chips using the configuration, and to write the configuration to the programmable chip on the memory module under test.

14. The motherboard-based memory-module tester of claim 13 wherein the configuration chip is an electrically erasable and programmable read-only memory (EEPROM) with a serial-data input.

15. The motherboard-based memory-module tester of claim 14 wherein the programmable chip on the memory module under test is initially un-programmed and contains no valid configuration when inserted into the test socket, but is programmed with the configuration after the memory chips pass a memory test when removed from the test socket, whereby the memory module under test is tested and programmed in one insertion.

16. A method for testing and programming a memory module using a personal computer (PC) motherboard comprising:

inserting a memory module under test into a test socket, the memory module under test having memory chips and a module configuration chip that is un-programmed;

re-booting a personal computer (PC) motherboard;

reading a configuration stored in an intercepting configuration chip on an extender card that contains the test socket and is plugged into a memory module socket on the PC motherboard;

configuring a memory controller on the PC motherboard using the configuration from the intercepting configuration chip on the extender card;

testing the memory chips using the memory controller after configuration, by writing to the memory chips on the memory module under test through the extender card, and reading the memory chips on the memory module under test through the extender card to test the memory chips; and programming a configuration into the module configuration chip on the memory module under test by the PC motherboard generating signals to send the configuration to the module configuration chip through the extender card, whereby the memory module under test is tested using the configuration from the extender card and programmed with the configuration using the PC motherboard.

17. The method of claim 16 wherein reading the configuration stored in the intercepting configuration chip comprises sending a first device address on a serial data line to the intercepting configuration chip and to the module configuration chip, the first device address matching a first device address input to the intercepting configuration chip;

wherein programming the configuration to the module configuration chip comprises sending a second device address on the serial data line to the intercepting configuration chip and to the module configuration chip, the second device address matching a second device address input to the module configuration chip but not matching the first device-address input to the intercepting configuration chip, whereby device addresses differ for the intercepting configuration chip and the module configuration chip.

18. The method of claim 17 wherein writing to the memory chips on the memory module comprises writing to substantially all memory locations on the memory chips to test all memory locations for failures.

19. The method of claim 18 wherein sending the first or second device address comprises sending a serial sequence of bits to both the intercepting configuration chip and to the module configuration chip, the serial sequence of bits including a command, and the first or second device address.

20. The method of claim 19 wherein reading a configuration stored in an intercepting configuration chip further comprises activating a basic-input-output-system BIOS routine to search for serial-presence-detect configuration chips in each memory module socket on the PC motherboard by generating a plurality of serial sequences having different device addresses.

* * * * *